(12) United States Patent
Yang et al.

(10) Patent No.: US 10,466,847 B2
(45) Date of Patent: Nov. 5, 2019

(54) CAPACITANCE SENSING CIRCUIT AND TOUCH PANEL FOR SENSING CAPACITANCE CHANGES

(71) Applicant: SHENZHEN GOODIX TECHNOLOGY CO., LTD., Shenzhen (CN)

(72) Inventors: Fuchiang Yang, Shenzhen (CN); Yanan Wen, Shenzhen (CN); Yingsi Liang, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/655,886

(22) Filed: Jul. 21, 2017

(65) Prior Publication Data
US 2017/0315642 A1    Nov. 2, 2017

Related U.S. Application Data

(63) Continuation of application No. PCT/CN2016/087999, filed on Jun. 30, 2016.

(30) Foreign Application Priority Data

Dec. 30, 2015 (CN) .......................... 2015 1 1025072

(51) Int. Cl.
*G06F 3/041* (2006.01)
*G06F 3/044* (2006.01)
(Continued)

(52) U.S. Cl.
CPC ............... *G06F 3/044* (2013.01); *G01D 5/24* (2013.01); *H03K 17/962* (2013.01); *H03K 2217/96073* (2013.01); *H03K 2217/96074* (2013.01)

(58) Field of Classification Search
CPC ...... G06F 1/1643; G06F 1/169; G06F 1/1692; G06F 3/03547; G06F 2200/1634;
(Continued)

(56) References Cited

U.S. PATENT DOCUMENTS

2008/0055260 A1    3/2008   Posamentier
2009/0244014 A1   10/2009   Hotelling et al.
(Continued)

FOREIGN PATENT DOCUMENTS

CN    1952864 A     4/2007
CN    101419522 A   4/2009
(Continued)

*Primary Examiner* — Sanghyuk Park (57) ABSTRACT

A capacitance sensing circuit includes: a front-end circuit, a first subtracting and summing circuit and a capacitance judging circuit; wherein the front-end circuit is coupled to the detection circuit; the first subtracting and summing circuit is coupled between the front-end circuit and the capacitance judging circuit, and includes: a subtracting unit; a summing unit, coupled to the subtracting unit; a first converter, coupled between the summing unit and the capacitance judging unit; and a second converter, coupled between the first converter and the subtracting unit; and the capacitance judging circuit is configured to judge a capacitance change of the detection capacitor. According to the present application, resistance against noise may be improved.

13 Claims, 8 Drawing Sheets

(51) Int. Cl.
  *G01D 5/24* (2006.01)
  *H03K 17/96* (2006.01)
(58) Field of Classification Search
  CPC ... G06F 2200/0339; G06F 2200/04101; G06F 2200/04103–04113; G06F 2200/04809
  See application file for complete search history.

(56) References Cited

U.S. PATENT DOCUMENTS

| | | |
|---|---|---|
| 2011/0063154 A1 | 3/2011 | Hotelling et al. |
| 2012/0043971 A1* | 2/2012 | Maharyta ............ G01R 27/2605 324/658 |
| 2012/0217981 A1* | 8/2012 | Erdogan ............ G01R 27/2605 324/679 |
| 2013/0135129 A1* | 5/2013 | Chang ...................... H03K 6/00 341/122 |
| 2014/0199944 A1 | 7/2014 | Ran et al. |
| 2014/0267144 A1 | 9/2014 | Kwon et al. |
| 2014/0368222 A1 | 12/2014 | Curtis |
| 2015/0130758 A1* | 5/2015 | Chang ................... G06F 3/0418 345/174 |
| 2016/0004347 A1* | 1/2016 | Lin ......................... G06F 3/044 345/174 |

FOREIGN PATENT DOCUMENTS

| | | |
|---|---|---|
| CN | 101673163 A | 3/2010 |
| CN | 102916729 A | 2/2013 |
| CN | 202815807 U | 3/2013 |
| CN | 103064571 A | 4/2013 |
| CN | 104020914 A | 9/2014 |
| WO | 2014101553 A1 | 7/2014 |

* cited by examiner

CAPACITANCE SENSING CIRCUIT AND TOUCH PANEL FOR SENSING CAPACITANCE CHANGES

CROSS-REFERENCE TO RELATED APPLICATIONS

The present application is a continuation of international application No. PCT/CN2016/087999 filed on Jun. 30, 2016, which claims the priority to Chinese Patent Application No. 201511025072.2, filed on Dec. 30, 2015, both of which are hereby incorporated by reference in their entireties.

TECHNICAL FIELD

The present application pertains to the technical field of capacitance detection, and in particular, relates to a capacitance sensing circuit and a touch panel which are capable of effectively sensing capacitance changes.

BACKGROUND

With constant advancement of the science and technology, in recent years, more and more humanized operation interfaces are designed for various electronic products. For example, over a touch panel, a user may operate or input information/texts/graphics on the screen with a finger or a stylus, which save the trouble of using such an input device as a keyboard or a keypad. In practice, the touch panel is typically including a sensing panel and a display arranged at the rear of the sensing panel. An electronic device judges the intension of a touch according to the position of the touch on the sensing panel and the image presented by the display, and performs a corresponding operation.

The capacitive touch technology judges a touch event by sensing the capacitance variation of a detection capacitor in a detection circuit. The conventional capacitive touch technology may be categorized into self-capacitance touch technology and mutual-capacitance touch technology. The capacitance sensing circuit in a self-capacitance touch panel or a mutual-capacitance touch panel is capable of converting the capacitance of the detection capacitor into an analog output signal, and converting the analog signal into a digital signal by using an analog-to-digital converter, thus for the judgment and determination of a capacitance judging circuit at the rear end. However, regardless of the self-capacitance touch panel or the mutual-capacitance touch panel, the capacitance variation of the detection capacitor thereof is tiny, such that the analog output signal is subject to the capacitance variation and thus the generated signal variation is correspondingly small. From another aspect, the analog output signal may include a fixed signal and a variable signal, wherein the variable signal is the signal variation when the analog output signal is subject to the capacitance variation. The capacitance sensing circuit judges the capacitance variation of the detection capacitor according to the variable signal in the analog output signal. In other words, the variable signal caused a significant effect on capacitance sensing. For a correct analysis of capacitance changes of the detection capacitor, in the related art, the analog output signal is parsed by using an analog-to-digital converter having a large dynamic range and a high resolution. As a result, the complexity and manufacture cost of the circuit are increased. In addition, the large dynamic range and high resolution of the analog-to-digital converter are mostly consumed in parsing the fixed signal portion of the analog output signal. However, the variable signal which is significant to capacitance sensing may not be parsed. Therefore, some improvements to the related art are desired.

SUMMARY

One technical problem to be solved by embodiments of the present application is to provide a capacitance sensing circuit, to effectively sense capacitance changes.

The embodiments of the present application are practiced by employing a capacitance sensing circuit, configured to sense a detection capacitor in a detection circuit, the capacitance sensing circuit includes a front-end circuit, a first subtracting and summing circuit and a capacitance judging circuit. The front-end circuit is coupled to the detection circuit, and includes at least one active component. The first subtracting and summing circuit is coupled between the front-end circuit and the capacitance judging circuit, and configured to generate a first output signal according to a first input signal, and the first subtracting and summing circuit includes: at least one subtracting unit, configured to generate at least one first subtracting signal according to a first signal;

at least one summing unit, coupled to the at least one subtracting unit of the first subtracting and summing circuit, and configured to generate at least one first summing signal according to the at least one first subtracting signal;

a first converter, coupled between the at least one summing unit of the first subtracting and summing circuit and the capacitance judging circuit, and configured to generate the first output signal; and a second converter, coupled between the first converter and the at least one subtracting unit of the first subtracting and summing circuit, and configured to convert the first output signal into the first signal.

The capacitance judging circuit is configured to judge a capacitance change of the detection capacitor.

Another technical problem to be solved by embodiments of the present application is to provide a touch panel, including the above capacitance sensing circuit.

The embodiments of the present application disclose a capacitance sensing circuit, configured to sense a detection capacitor in a detection circuit, the capacitance sensing circuit including: a front-end circuit, a first subtracting and summing circuit and a capacitance judging circuit; wherein the front-end circuit is coupled to the detection circuit, and includes at least one active component; the first subtracting and summing circuit is coupled between the front-end circuit and the capacitance judging circuit, and configured to generate a first output signal according to a first input signal, and the first subtracting and summing circuit includes: at least one subtracting unit, configured to generate at least one first subtracting signal according to a first signal; at least one summing unit, coupled to the at least one subtracting unit of the first subtracting and summing circuit, and configured to generate at least one first summing signal according to the at least one first subtracting signal; a first converter, coupled between the at least one summing unit of the first subtracting and summing circuit and the capacitance judging circuit, and configured to generate the first output signal; and a second converter, coupled between the first converter and the at least one subtracting unit of the first subtracting and summing circuit, and configured to convert the first output signal into the first signal; and the capacitance judging circuit is configured to judge a capacitance change the detection capacitor.

According to the present application, the capacitance sensing circuit improves the resistance against noise by using the front-end circuit including an active component, and a variation range of summing signals is restricted by using a subtracting and summing circuit. In this way, an analog-to-digital converter is prevented from entering a saturation state. As compared with the related art, the capacitance sensing circuit according to the present application has a higher signal-to-noise ratio and a stronger driving capability, avoids use of a large capacitor, lowers the requirements on the dynamic range and resolution of the analog-to-digital converter, reduces the complexity and manufacture cost of the circuit, on the other hand, it may improve the system precision.

BRIEF DESCRIPTION OF THE DRAWINGS

To describe technical solutions according to the embodiments of the present application or in the related art, drawings that are to be referred for description of the embodiments or the related art are briefly described hereinafter. Apparently, the drawings described hereinafter merely illustrate some embodiments of the present application. Persons of ordinary skill in the art may also derive other drawings based on the drawings described herein.

DETAILED DESCRIPTION

To make the objective, technical solution, and advantages of the present application clearer, the present application is further described with reference to specific embodiments and attached drawings. It should be understood that the specific embodiments described herein are only intended to explain the present application instead of limiting the present application.

Figure 1:
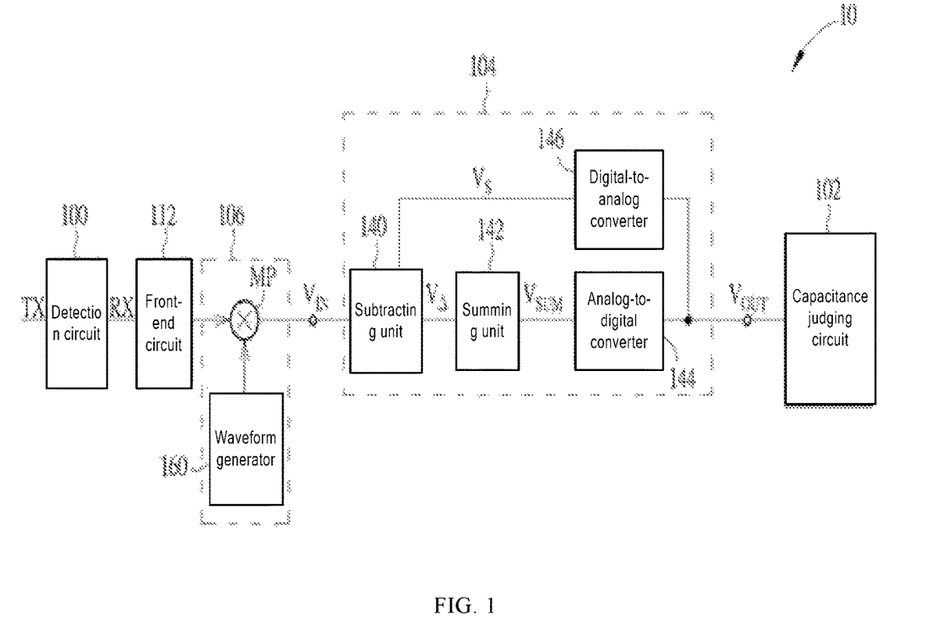
FIG. 1 is a schematic diagram of a capacitance sensing circuit according to Embodiment 1 of the present application.

Referring to FIG. 1, FIG. 1 is a schematic diagram of a capacitance sensing circuit 10 according to an embodiment of the present application. The capacitance sensing circuit 10 applies a signal TX to a detection circuit 100, and receives a signal RX from the detection circuit 100. The capacitance sensing circuit 10 senses a detection capacitor CUT of the detection circuit 100 according to the signal TX and the signal RX. The capacitance sensing circuit 10 includes a subtracting and summing circuit 104, a front-end circuit 112, a capacitance judging circuit 102 and a mixer 106.

The front-end circuit 112 includes an amplifier including an active component, and a filter. The front-end circuit 112 may adjust the signal RX by adjusting the gain of the amplifier, such that the signal RX does not get out of the operation range of a rear-end circuit component. The filter is configured to filter noise. Generally, the front-end circuit 112 may flexibly perform such operations as filter and amplification for noise and interference signals, which enhances the resistance of the capacitance sensing circuit 10 against the noise, and further improves the signal-to-noise ratio of the capacitance sensing circuit 10. In addition, the front-end circuit 112 including the active component may also enhance the driving capability of the circuit, and mitigate the impacts caused by the rear-end circuit to the front-end detection circuit 100 (in the related art, charges stored in the detection capacitor in the detection circuit are captured in a charge transfer or charge sharing manner by using a passive component, thus a capacitor with a capacitance identical to or greater than the detection capacitor is needed in the circuit, and thus the area of the circuit is increased). Signals may be adjusted when the active component is included in the circuit. Accordingly, the capacitor at the rear end does not need to match the detection capacitor, which effectively reduces the area of the circuit.

The mixer 106 is coupled between the front-end circuit 112 and the subtracting and summing circuit 104 (that is, coupled between the detection circuit 100 and the subtracting and summing circuit 104). The mixer 106 includes a multiplier MP and a waveform generator 160. The mixer 106 inputs an input signal VIN to the subtracting and summing circuit 104. The subtracting and summing circuit 104 generates an output signal VOUT according to the input signal VIN. The capacitance judging circuit 102 is coupled to the subtracting and summing circuit 104, and configured to judge a capacitance change of the detection capacitor according to the output signal VOUT.

The subtracting and summing circuit 104 may be a delta-sigma modulator (Δ-Σ modulator), and includes a subtracting unit 140, a summing unit 142, an analog-to-digital converter 144 (ADC, corresponding to a first converter) and a digital-to-analog converter 146 (DAC, corresponding to a second converter). The subtracting unit 140 generates a subtracting signal VΔ according to a signal VS (corresponding to a first signal) and the input signal VIN (corresponding to a first input signal), wherein the subtracting signal VΔ is a result after subtraction is made between the input signal VIN and the signal VS. The summing unit 142 is coupled to the subtracting unit 140, and configured to generate a summing signal VSUM according to the subtracting signal VΔ. The analog-to-digital converter 144 is coupled between the summing unit 142 and the capacitance judging circuit 102, and configured to convert the summing signal VSUM into the output signal VOUT. The digital-to-analog converter 146 is coupled between the analog-to-digital converter 144 and the subtracting unit 140, and configured to convert the output signal VOUT into the signal VS.

Figure 2:
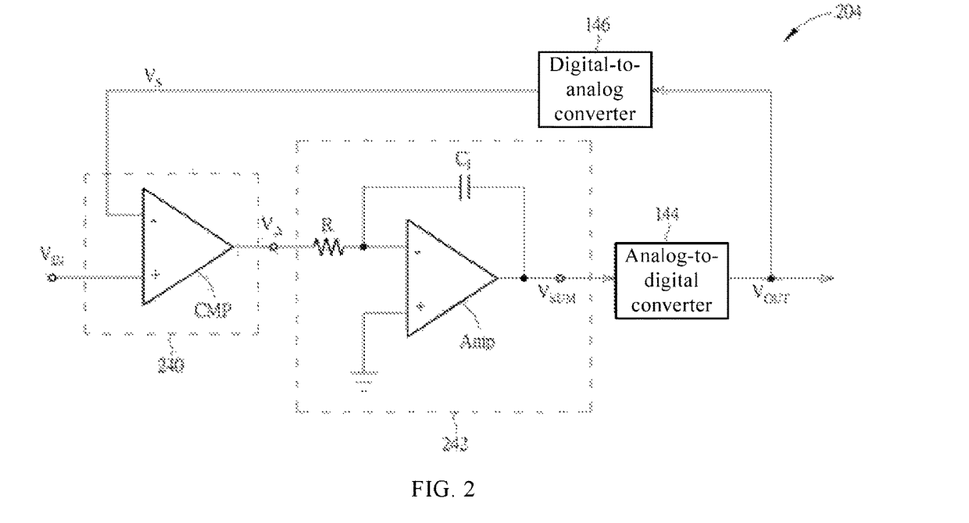
FIG. 2 is a first schematic diagram of a subtracting and summing circuit according to an embodiment of the present application.

With respect to an embodiment of the subtracting and summing circuit 104, referring to FIG. 2, FIG. 2 is a first schematic diagram of a subtracting and summing circuit 204 according to an embodiment of the present application. The subtracting and summing circuit 204 includes a subtracting unit 240, a summing unit 242, an analog-to-digital converter 144 and a digital-to-analog converter 146.

The subtracting unit 240 includes a comparator CMP, wherein the comparator CMP includes a negative input terminal (which corresponds to a first input terminal and is marked with sign "−"), a positive input terminal (which corresponds to a second input terminal and is marked with sign "+") and an output terminal. The negative input terminal of the comparator CMP is coupled to the digital-to-analog converter 146, and configured to receive a signal VS, the positive input terminal of the comparator CMP is configured to receive an input signal VIN, and the output terminal of the comparator CMP is coupled to the summing unit 242, and configured to output a subtracting signal VΔ. The summing unit 242 may be an integrator and includes an amplifier Amp, an integrating capacitor CI and a resistor R. The amplifier Amp includes a negative input terminal (which is marked with sign "−"), a positive input terminal (which is marked with sign "+") and an output terminal. The negative input terminal of the amplifier Amp is coupled to one terminal of the resistor R and the other terminal of the resistor R is coupled to the subtracting unit 240 to receive the subtracting signal VΔ. The positive input terminal of the amplifier Amp is coupled to the ground terminal. The integrating capacitor CI is coupled between the negative input terminal and the output terminal of the amplifier Amp. The output terminal of the amplifier Amp is configured to output the summing signal VSUM. The other operations are the same as those of the subtracting and summing circuit 104, which are not described herein any further.

Figure 3:
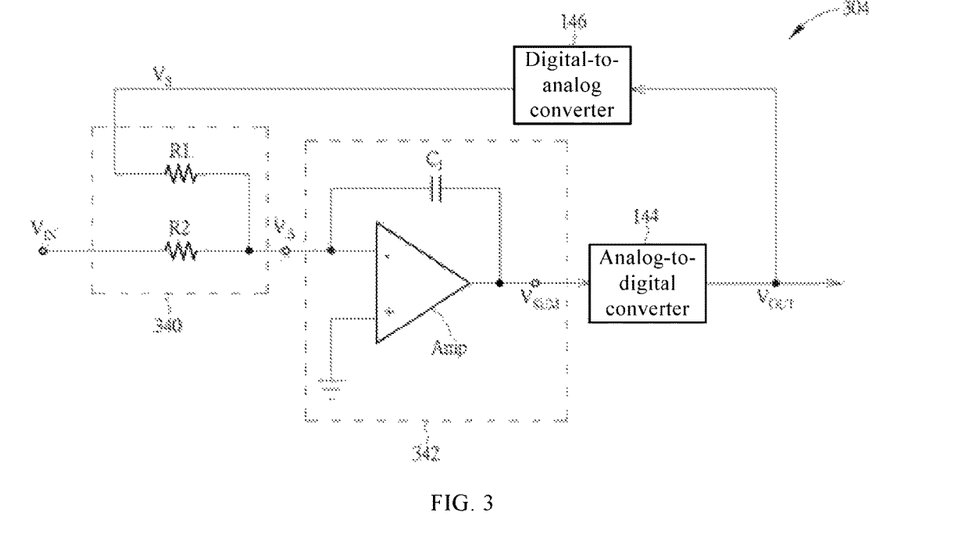
FIG. 3 is a second schematic diagram of a subtracting and summing circuit according to an embodiment of the present application.

With respect to another embodiment of the subtracting and summing circuit 104, referring to FIG. 3, FIG. 3 is a second schematic diagram of a subtracting and summing circuit 304 according to an embodiment of the present application. The subtracting and summing circuit 304 is similar to the subtracting and summing circuit 204, and thus like components are denoted by the like reference signs. Different from the subtracting and summing circuit 204, a summing unit 342 included in the subtracting and summing circuit 304 only includes an amplifier Amp and an integrating capacitor CI, and a subtracting unit 340 included in the subtracting and summing circuit 304 includes resistors R1 and R2. The resistor R1 is coupled between a negative input terminal of the amplifier Amp and the digital-to-analog converter 146. One terminal of the resistor R2 is coupled to the negative input terminal of the amplifier Amp, and the other terminal of the resistor R2 is coupled to the front-end circuit 112 to receive the input signal VIN. The other operations are the same as those of the subtracting and summing circuit 104, which are not described herein any further.

Figure 8:
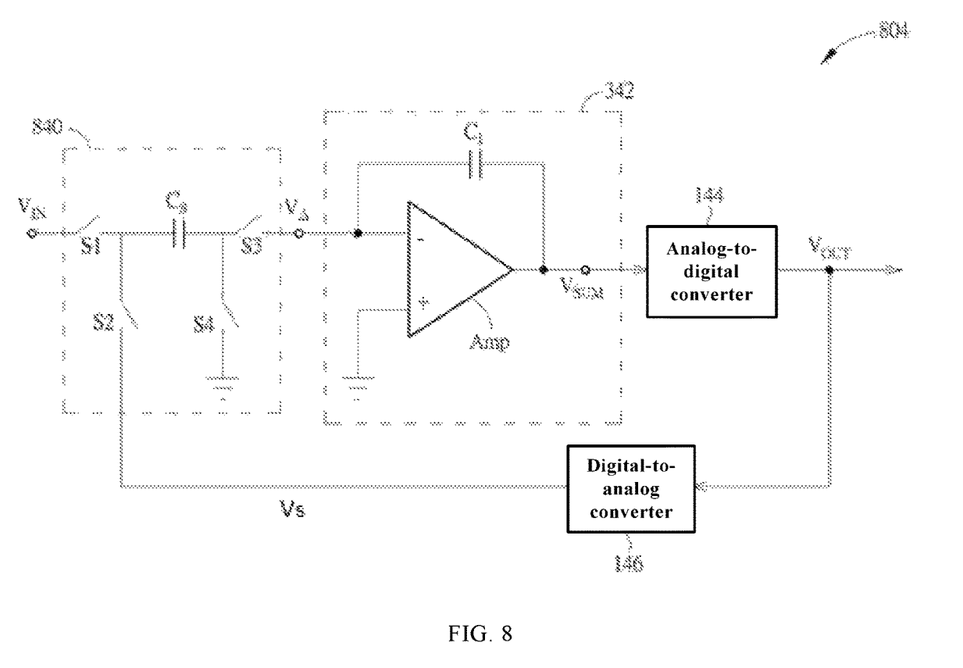
FIG. 8 is a third schematic diagram of a subtracting and summing circuit according to an embodiment of the present application.

With respect to still another embodiment of the subtracting and summing circuit 104, referring to FIG. 8, FIG. 8 is a third schematic diagram of a subtracting and summing circuit 804 according to an embodiment of the present application. The subtracting and summing circuit 804 is similar to the subtracting and summing circuit 304, and thus like components are denoted by the like reference signs. Different from the subtracting and summing circuit 304, a subtracting unit 840 included in the subtracting and summing circuit 804 includes a capacitor CS and switches S1, S2, S3 and S4. The switch S1 is coupled to a first terminal of the capacitor CS, and configured to receive the input signal VIN. The switch S2 is coupled between the first terminal of the capacitor CS and the digital-to-analog converter 146. The switch S3 is coupled between a second terminal of the capacitor CS and the negative input terminal of the amplifier Amp. The switch S4 is coupled between the second terminal of the capacitor CS and the ground terminal. The switches S1, S2, S3 and S4 may be controlled by frequency control signals ph1 and ph2, wherein the frequency control signals ph1 and ph2 are frequency control signals that are orthogonal to each other (that is, time intervals of high levels of the frequency control signals ph1 and ph2 are not overlapped). Specifically, in an embodiment, the frequency control signal ph1 may be used to control conduction states of the switches S1 and S3, and the frequency control signal ph2 may be used to control conduction states of the switches S2 and S4. In another embodiment, the frequency control signal ph1 may be used to control conduction states of the switches S1 and S4, and the frequency control signal ph2 may be used to control conduction states of the switches S2 and S3. The other operations are the same as those of the subtracting and summing circuit 104, which are not described herein any further.

Figure 4:
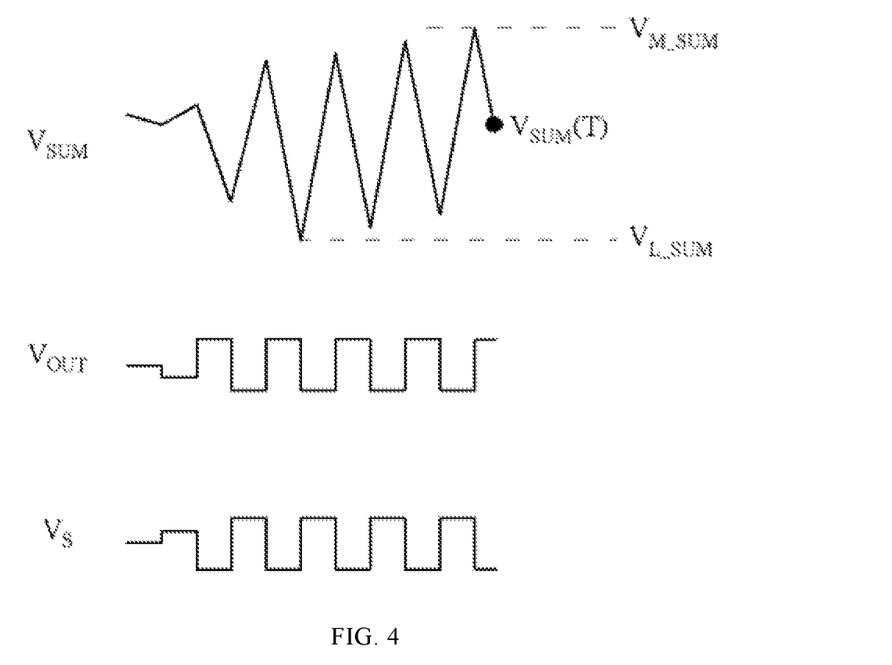
FIG. 4 illustrates waveforms of a plurality of signals according to an embodiment of the present application.

If the analog-to-digital converter 144 and the digital-to-analog converter 146 are properly designed, the signal value of the summing signal VSUM may be limited within a specific range. For example, referring to FIG. 4, FIG. 4 illustrates waveforms of the summing signal VSUM, the output signal VOUT and the signal VS which change with the time according to an embodiment of the present application. In this embodiment, the summing signal VSUM is a contiguous analog signal whereas the output signal VOUT is a discrete signal. As illustrated in FIG. 4, even if the subtracting and summing circuit according to the present application operates for a long period of time, the variation range of the signal VSUM still falls between a maximum voltage VM_SUM and a minimum voltage VL_SUM. Therefore, the variation range of the signal VSUM is prevented from exceeding the dynamic range of the analog-to-digital converter 144, that is, the analog-to-digital converter 144 is prevented from entering the saturation state. Therefore, the requirements imposed by the capacitance sensing circuit on the dynamic range and resolution of the analog-to-digital converter are lowered. In addition, with respect to the analog-to-digital converter 144 having a specific precision, the precision of the capacitance sensing circuit 10 may be improved.

In the related art, the capacitance sensing circuit captures charges stored in the detection capacitor in the detection circuit in a charge transfer or charge sharing manner by using a passive component, and such process is subject to noise and thus the capacitance judging circuit misjudges the capacitance change of the detection capacitor. By contrast, the capacitance sensing circuit 10, by using the front-end circuit 112 including an active component, may flexibly perform such operations as filter and amplification for noise and interference signals, enhance the resistance of the capacitance sensing circuit 10 against the noise, and further improve the signal-to-noise ratio (SNR) of the capacitance sensing circuit. In addition, the front-end circuit including an active component may enhance the driving capability of the circuit, and mitigate the impacts caused by the rear-end circuit to the front-end detection circuit. The front-end circuit including an active component may adjust signals. Accordingly, the integrating capacitor at the rear end does not need to match the detection capacitor, which effectively reduces the area of the circuit. Further, the capacitance sensing circuit 10 restricts the variation range of the summing signal VSUM by using the subtracting and summing circuit 104, and thus the analog-to-digital converter 144 is prevented from entering the saturation state. As compared with the related art, the capacitance sensing circuit 10 lowers the requirements on the dynamic range of the analog-to-digital converter 144, and thus reduces the complexity and manufacture cost of the circuit. In addition, with respect to the analog-to-digital converter 144 having a specific precision, the precision of the capacitance sensing circuit 10 is also improved.

Figure 5:
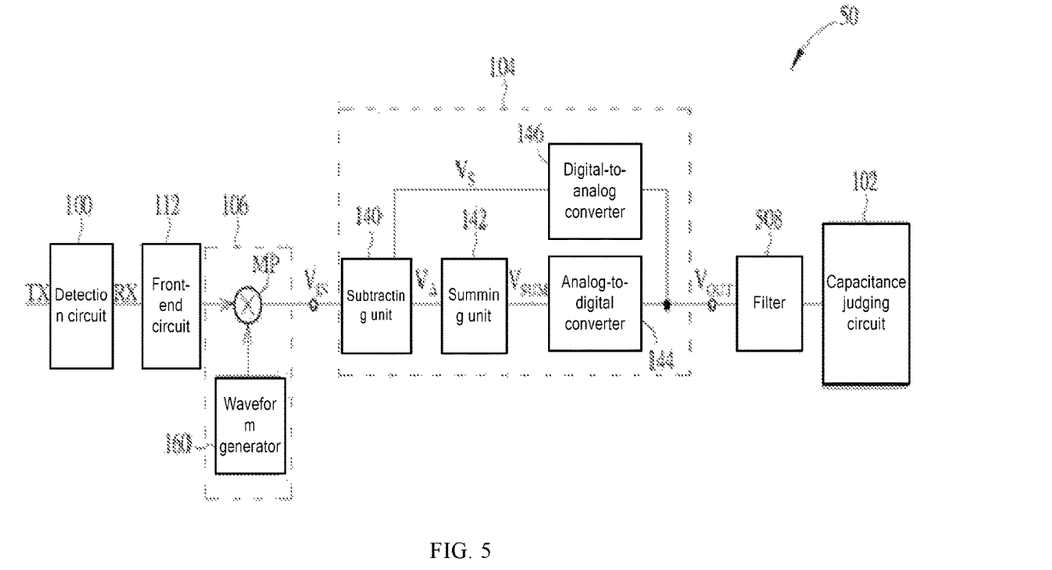
FIG. 5 is a schematic diagram of a capacitance sensing circuit according to Embodiment 2 of the present application.

It should be noted that the preceding embodiments are used to describe the concepts of the present application. A person skilled in the art may make different modifications or polishments to the present disclosure without any limitation to the above given embodiments. For example, referring to FIG. 5, FIG. 5 is a schematic diagram of a capacitance sensing circuit 50 according to Embodiment 2 of the present application. The capacitance sensing circuit 50 is similar to the capacitance sensing circuit 10, and thus like components are denoted by the like reference signs. Different from the capacitance sensing circuit 10, the capacitance sensing circuit 50 further includes a filter 508. The filter 508 is coupled between the analog-to-digital converter 144 and the capacitance judging circuit 102, and configured to eliminate the quantization error caused by the analog-to-digital converter 144, which also falls within the scope of the present application.

Figure 9:
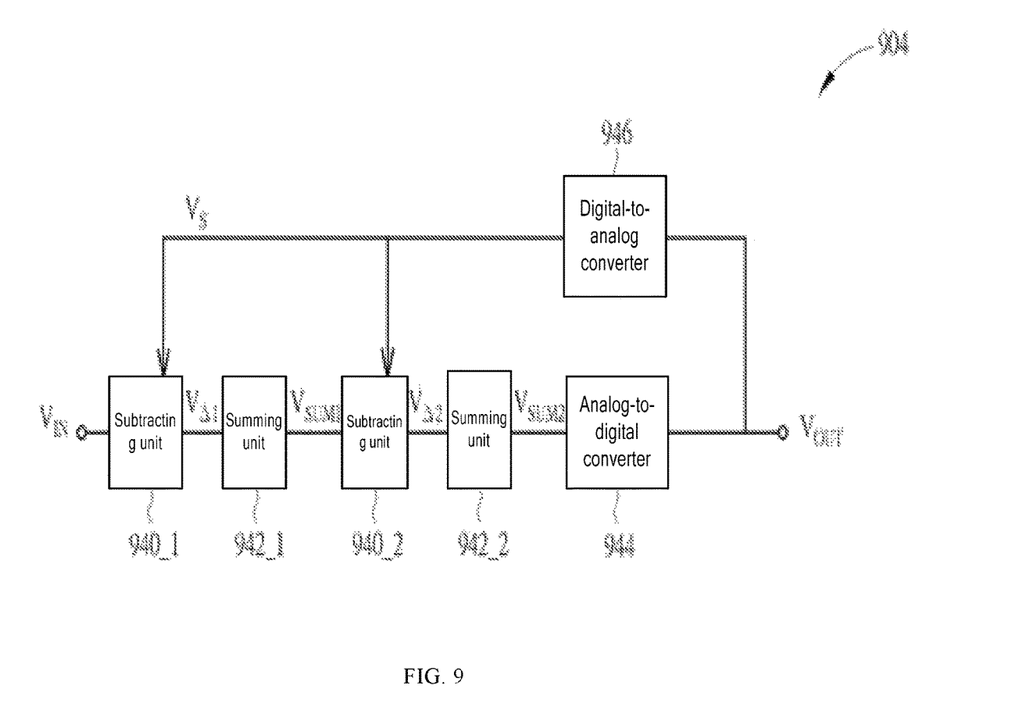
FIG. 9 is a fourth schematic diagram of a subtracting and summing circuit according to an embodiment of the present application.

Furthermore, it should be noted that the subtracting and summing circuits 104, 204, 304 and 804 are all one-order delta-sigma modulators, which are not limited hereto. Instead, the subtracting and summing circuits according to the present application may also be practiced by using two-order delta-sigma modulators. For example, referring to FIG. 9, FIG. 9 is a fourth schematic diagram of a subtracting and summing circuit 904 according to an embodiment of the present application. The subtracting and summing circuit 904 includes subtracting units 940_1 and 940_2, summing units 942_1 and 942_2, an analog-to-digital converter 944 and a digital-to-analog converter 946.

The summing units 942_1 and 942_2 are respectively coupled to the subtracting units 940_1 and 940_2. The summing units 942_1 and 942_2 respectively generate a signal VSUM 1 and a signal VSUM 2 according to subtracting signals V$\Delta$1 and V$\Delta$2. The subtracting units 940_1 and 940_2 are both coupled to the digital-to-analog converter 946. The analog-to-digital converter 944 is coupled to the summing unit 942_2, and configured to convert the summing signal VSUM 2 into the output signal VOUT. The digital-to-analog converter 946 is coupled between the analog-to-digital converter 944 and the subtracting units 940_1 and 940_2, and configured to convert the output signal VOUT into the signal VS. In brief, the subtracting and summing circuit 904 is a two-order delta-sigma modulator, which is not limited hereto. The subtracting and summing circuit according to the present application may also be practiced by using a three-order or higher-order delta-sigma modulator, and such practice also falls within the scope of the present application.

Figure 6:
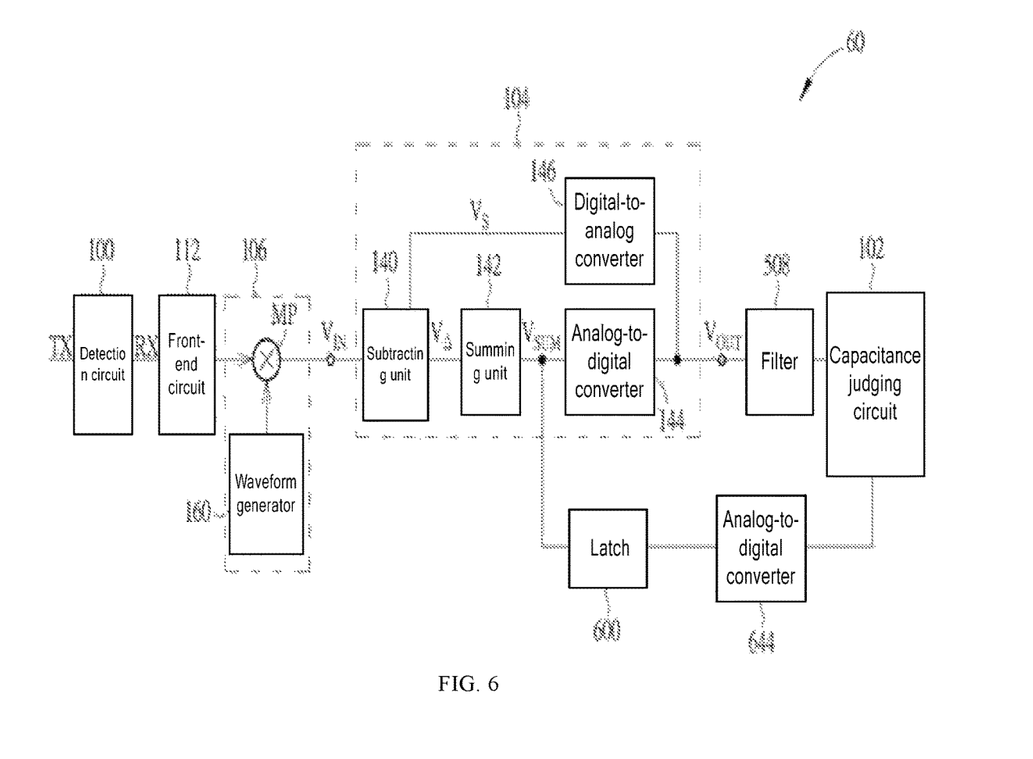
FIG. 6 is a schematic diagram of a capacitance sensing circuit according to Embodiment 3 of the present application.

In addition, to more accurately calculate the charges stored in the detection capacitor CUT, the capacitance sensing circuit may maintain the voltage of the summing signal VSUM for a period of time and then convert the summing signal VSUM into a digital signal and transmit the digital signal to the capacitance judging circuit 102. Specifically, referring to FIG. 6, FIG. 6 is a schematic diagram of a capacitance sensing circuit 60 according to Embodiment 3 of the present application. The capacitance sensing circuit 60 is similar to the capacitance sensing circuit 50, and thus like components are denoted by the like reference signs. Different from the capacitance sensing circuit 50, the capacitance sensing circuit 60 further includes a latch 600 and an analog-to-digital converter 644 (corresponding to a third converter), wherein the latch 600 is coupled to the summing unit 142, and configured to maintain the voltage of the summing signal VSUM for a specified period of time. The analog-to-digital converter 644 is coupled between the latch 600 and the capacitance judging circuit 102, and configured to convert the summing signal VSUM that is maintained for the specified period of time into a digital signal and transmit the digital signal to the capacitance judging circuit 102. As such, the capacitance sensing circuit 60 is capable of more accurately judging the capacitance change of the detection capacitor CUT, and enhancing the overall efficiency.

Figure 7:
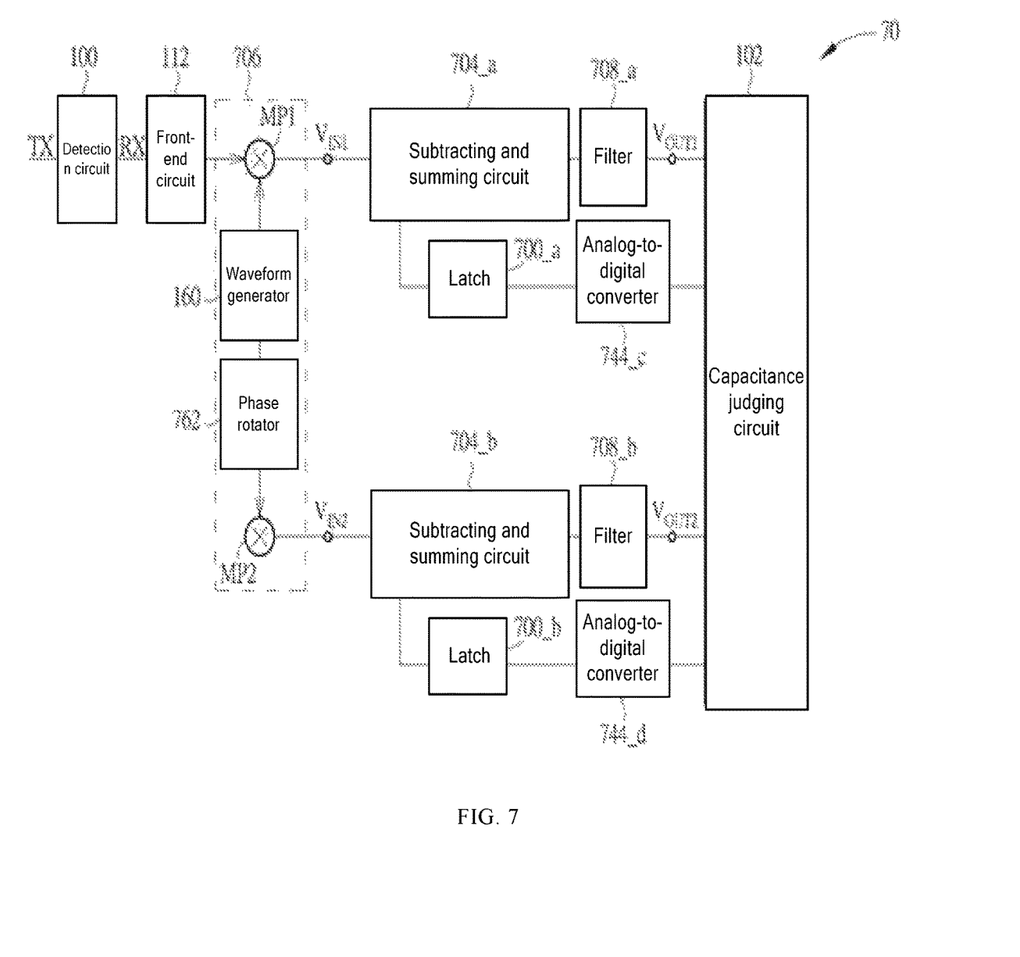
FIG. 7 is a schematic diagram of a capacitance sensing circuit according to Embodiment 4 of the present application.

In addition, in the capacitance sensing circuit 10, an operation is carried out for the in-phase component of the signal RX, which is not limited hereto; instead, an operation may also be carried out simultaneously for the in-phase component and the quadrature component of the signal RX, so as to more accurately determine the capacitance of the detection capacitor CUT. For example, referring to FIG. 7, FIG. 7 is a schematic diagram of a capacitance sensing circuit 70 according to Embodiment 4 of the present application. The capacitance sensing circuit 70 is similar to the capacitance sensing circuit 10, and thus like components are denoted by the like reference signs. Like the capacitance sensing circuit 10, the capacitance sensing circuit 70 carries out an operation for the in-phase component of the signal RX by using a subtracting and summing circuit 704_a. However, different from the capacitance sensing circuit 10, the capacitance sensing circuit 70 includes subtracting and summing circuits 704_a and 704_b, wherein the subtracting and summing circuit 704_a carries out an operation for the in-phase component of the signal RX. In addition, the capacitance sensing circuit 70 captures the quadrature component of the signal RX by using a phase rotator 762 and a multiplier MP2 included in a mixer 706, and carries out an operation for the quadrature component of the signal RX by using the subtracting and summing circuit 704_b. The subtracting and summing circuits 704_a and 704_b respectively output a signal VOUT 1 and a signal VOUT 2, and the capacitance judging circuit 102 may judge a capacitance change of the detection capacitor CUT according to the output signals VOUT 1 and VOUT 2. The subtracting and summing circuits 704_a and 704_b may be practiced by using the subtracting and summing circuits 104, 204, 304, 804 and 904, and such practice falls within the scope of the present application. In addition, the capacitance sensing circuit 70 further includes filters 708_a and 708_b, latches 700_a and 700_b, and analog-to-digital converters 744_c and 744_d. The operation manners and functions of the filters 708_a and 708_b, the latches 700_a and 700_b, and the analog-to-digital converters 744_c and 744_d may be referenced to the above description, which are thus not described herein any further.

In conclusion, the capacitance sensing circuit according to the present application improves the resistance against noise by using the front-end circuit including an active component, improves the driving capability of the circuit, and avoids use of a large-sized capacitor. Further, the capacitance sensing circuit according to the present application limits the variation range of the summing signals by using the subtracting and summing circuit, and prevents the analog-to-digital converter from entering the saturation state. As compared with the related art, the capacitance sensing circuit according to the present application has a high signal-to-noise ratio, lowers the requirements on the dynamic range and resolution of the analog-to-digital converter, reduces the complexity and manufacture cost of the circuit, and improves the precision of the capacitance sensing circuit with respect to the analog-to-digital converter having a specific precision.

The above described capacitance sensing circuit 10 may be applied to a touch panel and an electronic device having a touch panel.

Described above are merely preferred embodiments of the present application, but are not intended to limit the present application. Any modification, equivalent replacement, or improvement made without departing from the spirit and principle of the present application should fall within the protection scope of the present application.

What is claimed is:

1. A capacitance sensing circuit, configured to sense a detection capacitor in a detection circuit, comprising:
    a front-end circuit coupled to the detection circuit, wherein the front-end circuit comprises at least one active component and a filter, wherein the front-end circuit is configured to perform filter and amplification operations for noise and interference signals so as to enhance resistance of the capacitance sensing circuit against noise;
    a first subtracting and summing circuit coupled between the front-end circuit and a capacitance judging circuit of the capacitance sensing circuit, wherein the first subtracting and summing circuit is configured to generate a first output signal according to a first input signal; and
    the capacitance judging circuit configured to judge a capacitance change of the detection capacitor according to the first output signal,
    wherein the first subtracting and summing circuit comprises:
        at least one subtracting unit, configured to generate at least a first subtracting signal according to a first signal;
        at least one summing unit, coupled to the at least one subtracting unit, and configured to generate at least a first summing signal according to the first subtracting signal;
        a first converter, coupled between the at least one summing unit and the capacitance judging circuit, and configured to generate the first output signal; and
        a second converter, coupled between the first converter and the at least one subtracting unit, and configured to convert the first output signal into the first signal,
            wherein the subtracting unit comprises a first capacitor, a first switch, a second switch, a third switch and a fourth switch, wherein the first switch and the second switch are coupled to a first terminal of the first capacitor, the third switch and the fourth switch are coupled to a second terminal of the first capacitor, the first switch is configured to receive the first input signal, the second switch is coupled to the second converter, the third switch is coupled to the at least one summing unit and configured to output the first subtracting signal, and the fourth switch is coupled to a ground terminal.

2. The capacitance sensing circuit according to claim 1, wherein the summing unit comprises:
    an amplifier, wherein a negative input terminal of the amplifier is configured to receive the first subtracting signal, and an output terminal of the amplifier is configured to output the first summing signal; and
    an integrating capacitor, coupled between the negative input terminal and the output terminal of the amplifier.

3. The capacitance sensing circuit according to claim 1, wherein the first converter is an analog-to-digital converter, and the second converter is a digital-to-analog converter.

4. The capacitance sensing circuit according to claim 1, further comprising a first filter coupled between the first converter and the capacitance judging circuit, wherein the first filter is configured to filter the first output signal.

5. The capacitance sensing circuit according to claim 1, further comprising a first latch coupled between the summing unit and the capacitance judging circuit for maintaining the first summing signal.

6. The capacitance sensing circuit according to claim 5, further comprising a third converter, coupled between the first latch and the capacitance judging circuit.

7. The capacitance sensing circuit according to claim 6, wherein the third converter is an analog-to-digital converter.

8. The capacitance sensing circuit according to claim 1, further comprising a mixer coupled between the front-end circuit and the first subtracting and summing circuit.

9. The capacitance sensing circuit according to claim 8, wherein the mixer comprises a first multiplier and a waveform generator.

10. The capacitance sensing circuit according to claim 9, wherein the mixer further comprises a phase rotator and a second multiplier;
    the capacitance sensing circuit further comprises:
        a second subtracting and summing circuit, coupled between the second multiplier and the capacitance judging circuit, and configured to generate a second output signal according to a second input signal, wherein the second subtracting and summing circuit comprises:
            at least one subtracting unit, configured to generate at least one second subtracting signal according to a second signal;
            at least one summing unit, coupled to the at least one subtracting unit of the second subtracting and summing circuit, and configured to generate at least one second summing signal according to the at least one second subtracting signal;
            a fourth converter, coupled between the at least one summing unit of the second subtracting and summing circuit and the capacitance judging circuit, and configured to generate the second output signal; and
            a fifth converter, coupled between the fourth converter and the at least one subtracting unit of the second subtracting and summing circuit, and configured to convert the second output signal into the second signal; and
        the capacitance judging circuit is configured to judge a capacitance change of the detection capacitor according to the first output signal and the second output signal.

11. A touch panel, comprising:
    at least a detection capacitor;
    a capacitance sensing circuit, comprising: a front-end circuit coupled to the detection capacitor, wherein the front-end circuit comprises at least one active component and a filter, wherein the front-end circuit is configured to perform filter and amplification operations for noise and interference signals so as to enhance resistance of the capacitance sensing circuit against noise;
    a first subtracting and summing circuit coupled between the front-end circuit and the capacitance judging circuit, wherein the first subtracting and summing circuit is configured to generate a first output signal according to a first input signal; and a capacitance judging circuit configured to judge a capacitance change of the detection capacitor according to the first output signal, wherein the first subtracting and summing circuit comprises:
- at least one subtracting unit, configured to generate at least a first subtracting signal according to a first signal;
- at least one summing unit, coupled to the at least one subtracting unit, and configured to generate at least a first summing signal according to the first subtracting signal;
- a first converter, coupled between the at least one summing unit and the capacitance judging circuit, and configured to generate the first output signal; and
- a second converter, coupled between the first converter and the at least one subtracting unit, and configured to convert the first output signal into the first signal,
   - wherein the subtracting unit comprises a first capacitor, a first switch, a second switch, a third switch and a fourth switch, wherein the first switch and the second switch are coupled to a first terminal of the first capacitor, the third switch and the fourth switch are coupled to a second terminal of the first capacitor, the first switch is configured to receive the first input signal, the second switch is coupled to the second converter, the third switch is coupled to the at least one summing unit and configured to output the first subtracting signal, and the fourth switch is coupled to a ground terminal.

12. The touch panel according to claim 11, wherein the summing unit comprises:
- an amplifier, wherein a negative input terminal of the amplifier is configured to receive the first subtracting signal, and an output terminal of the amplifier is configured to output the first summing signal; and
- an integrating capacitor, coupled between the negative input terminal and the output terminal of the amplifier.

13. The touch panel according to claim 11, wherein the first converter is an analog-to-digital converter, and the second converter is a digital-to-analog converter.

* * * * *